US008261224B2

(12) United States Patent
Malgioglio et al.

(10) Patent No.: US 8,261,224 B2
(45) Date of Patent: Sep. 4, 2012

(54) COMPUTER PROGRAM PRODUCT, APPARATUS, AND METHOD FOR INSERTING COMPONENTS IN A HIERARCHICAL CHIP DESIGN

(75) Inventors: Frank Malgioglio, Hopewell Junction, NY (US); Christopher J. Berry, Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 12/034,644

(22) Filed: Feb. 20, 2008

(65) Prior Publication Data

US 2009/0210845 A1 Aug. 20, 2009

(51) Int. Cl.
*G06F 17/50* (2006.01)
(52) U.S. Cl. ........ 716/122; 716/118; 716/119; 716/123; 716/132
(58) Field of Classification Search ................ 716/8, 10, 716/11, 118, 119, 122, 132
See application file for complete search history.

(56) References Cited

U.S. PATENT DOCUMENTS

| 5,051,917 | A  | * | 9/1991  | Gould et al.      | 257/203 |
| 6,085,032 | A  | * | 7/2000  | Scepanovic et al. | 716/10  |
| 6,487,702 | B2 |   | 11/2002 | Lin et al.        |         |
| 6,618,843 | B2 |   | 9/2003  | Dansky et al.     |         |
| 6,618,844 | B2 |   | 9/2003  | Dansky et al.     |         |
| 6,763,509 | B2 |   | 7/2004  | Korobkov          |         |
| 6,904,582 | B1 |   | 6/2005  | Rittman et al.    |         |
| 7,193,262 | B2 |   | 3/2007  | Ho et al.         |         |
| 7,269,806 | B2 |   | 9/2007  | Berry et al.      |         |
| 7,315,054 | B1 | * | 1/2008  | Moench et al.     | 257/304 |
| 7,337,425 | B2 | * | 2/2008  | Kirk              | 716/55  |
| 2004/0250228 | A1 | * | 12/2004 | Clabes et al.   | 716/8   |
| 2006/0190877 | A1 |   | 8/2006  | Berry et al.    |         |
| 2006/0200783 | A1 | * | 9/2006  | Berry et al.    | 716/5   |
| 2008/0201677 | A1 | * | 8/2008  | Baker et al.    | 716/8   |
| 2009/0282380 | A1 | * | 11/2009 | Chadwick et al. | 716/9   |

OTHER PUBLICATIONS

Capacitance and Yield Evaluations Using a 90-nm Process Technology Based on the Dense Power-Ground Interconnect Architecture, Kurokawa et al., Proceedings of the Sixth International Symposium on Quality Electronic Design (SQED'05) IEEE Computer Society, Mar. 2005.
Scaling Analysis of On-Chip Power Grid Voltage Variations in Nanometer Scale ULSI, Ajami et al., (no. date).
Decoupling Capacitance Allocation in Noise-Aware Floorplanning based on DBL Representation, Jin-Tai Yan et al., 2005 IEEE, pp. 2219-2222.
zArchitecture Principles of Operation, Publication #sa22-7832-05, Sixth Edition (Apr. 2007), copyright IBM Corp., 1990-2007, Part 1.

(Continued)

*Primary Examiner* — Paul Dinh
*Assistant Examiner* — Patrick Sandoval
(74) *Attorney, Agent, or Firm* — Cantor Colburn LLP; William A. Kinnaman, Jr.

(57) ABSTRACT

Components are inserted into a cell-based current chin design with multiple levels of nested hierarchy. A selection of components having various silicon densities to insert into the current chip design is received. The components are inserted into the current chip design such that the components do not touch or overlap existing circuits or silicon shapes in the current chip design. The components are inserted such that components having highest silicon densities are placed further away from the existing circuits or silicon shapes than components having lower silicon densities.

21 Claims, 7 Drawing Sheets

OTHER PUBLICATIONS zArchitecture Principles of Operation, Publication #sa22-7832-05, Sixth Edition (Apr. 2007), copyright IBM Corp., 1990-2007, Part 2.

zArchitecture Principles of Operation, Publication #sa22-7832-05, Sixth Edition (Apr. 2007), copyright IBM Corp., 1990-2007, Part 3.

zArchitecture Principles of Operation, Publication #sa22-7832-05, Sixth Edition (Apr. 2007), copyright IBM Corp., 1990-2007, Part 4.

* cited by examiner

ADD DECOUPLING CAPS FORM

OK  CANCEL  DEFAULTS  APPLY                                                          HELP

FLOORPLAN TO ANALYZE                                    TARGET CELLVIEW FOR DECAPS

LIB NAME [ ep_zmt ]          SELECT WINDOW CELLVIEW      LIB NAME [ ep_zmt ]
CELL NAME [ ep_zchip ]       USE SAME CELL FOR BOTH      CELL NAME [ ep_zchip_decap ]   } 620
VIEW NAME [ autoRouted ]                                 VIEW NAME [ layout ]

610

630 — Check for M1 overlaps? ☐ (select if design has already been routed and uses M1 - decreases decap efficiency and increases run time)

640 — Run incrementally? ☐ (keeps existing decaps from the cell above)

650 — Use child OVERLAP shapes instead of prBoundary? ■ (will default to prBoundary if OVERLAP shapes don't exist in child cells)

660 — Exclude cover cells from blockage list? ☐ (ignores any cell with viewName = cover)

670 — Additional cellnames to exclude from blockage list: [            ]

680 — Decap cell type: [ vdd ]  WARNING: shorts may be created if you have multiple power domains in your unit 690 — Min space between macros and high PC-density decaps (um) [ 10 ] (0 = highest decap efficiency, 30 = least amount of ACLVAB errors to fix, 25 = default)

695 — Min space between macros and all decaps (um) [ 0 ] (0 is the default which will abut decaps to macros)

HELP (how does this work?)

COMPUTER PROGRAM PRODUCT, APPARATUS, AND METHOD FOR INSERTING COMPONENTS IN A HIERARCHICAL CHIP DESIGN

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

This invention relates generally to chip design, and more particularly, to inserting components, such as decoupling capacitors, in a hierarchical chip design.

As semiconductor technologies become more complex and condensed, if becomes difficult to use simple algorithms to insert components, such as decoupling capacitors, into chip designs, e.g., cell-based Very Large Scale Integration (VLSI) chip designs, without violating manufacturing ground rules or incurring numerous iterations of checking and manual tweaking. In a very eel I-based hierarchical VLSI, design, decoupling capacitors, also referred to as decaps, are usually inserted at each level of hierarchy and brought together at the chip or parent level. This leads to undesired interactions between those hierarchies at the top level and requires a good amount of debugging and ripping up.

Also, the latest Complementary Metal Oxide Semiconductor (CMOS) technologies are very sensitive to silicon densities and uniformity of silicon layers, which has led to the creation of specialized ground rules to control process variations across the chip's area, also known, as Across Chip Line Variation (ACLV). Some of these rules are very complex and can be triggered by the interaction of different circuit types.

There is thus a need for a technique for inserting components into a hierarchical chip design without violating ground rules for controlling process variations across the chip.

BRIEF SUMMARY OF THE INVENTION

An exemplary embodiment includes a computer program product for inserting components into a cell-based current chip design with multiple levels of nested hierarchy. The computer program product comprises a computer-readable storage medium readable by a processing circuit and storing instructions for executing by the processing circuit for performing a method comprising selecting components having various silicon densities to Insert into the current chip design and inserting components into the current chip design such that the components do not touch or overlap existing circuits or silicon shapes in the current chip design. The components are Inserted such that components having highest silicon densities are placed further away from the existing circuits or silicon shapes than components having lower silicon densities.

Another exemplary embodiment includes an apparatus for inserting components into a cell-based current chip design with multiple levels of nested hierarchy. The apparatus comprises an input for receiving a selection of components having various silicon densities to insert into the current chip design and a processor for performing a method comprising inserting the components into the current chip design such that the components do not touch or overlap existing circuits or silicon shapes in the current chip design. The components are inserted such that components having highest silicon densities are placed further away from the existing circuits or silicon shapes than components having lower silicon densities.

A further exemplary embodiment includes a method for inserting components into a cell-based current chip design with multiple levels of nested hierarchy. The method comprises receiving a selection of components having various silicon densities to insert into the current chip design and inserting components into the current chip design such that the components do not touch or overlap existing circuits or silicon shapes in the current chip design. The components are inserted such that components having highest silicon densities are placed further away from the existing circuits or silicon shapes than components having lower silicon densities.

Additional features and advantages are realized through the techniques of the present, invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

Referring now to the drawings wherein like elements are numbered alike in the several figures.

The detailed description, explains the preferred embodiments of the invention, together with advantages and features, by way of example with reference to the drawings. However, It will be appreciated that the invention is not limited to the specific embodiment described herein.

DETAILED DESCRIPTION OF EXEMPLARY EMBODIMENTS

According to exemplary embodiments, a technique is provided for inserting components, such as decaps, into a VLSI design with user controlled options to control the types of decap cells and the proximity of their placement to adjacent circuitry. This allows for better-control of silicon density in a VLSI design, thus avoiding manufacturing ground rule errors that could cause costly design churn.

An exemplary embodiment of the present invention allows the addition of decoupling capacitors in a flat or hierarchical chip design while ensuring that no undesired decap interactions exist at hierarchical boundaries. Also, exemplary embodiments provide a chip designer the flexibility to control silicon density around critical gates, in accordance with the ACLV manufacturing ground rules.

According to an aspect of the invention, a technique is provided for inserting components, such as decaps, in either a flat or hierarchical chip design. While inserting decaps into a flat design is not very challenging, it is to be able to insert decaps in a hierarchical design in which the levels of hierarchy, also referred to as "units", don't necessarily have to be rectangular but instead can overlap other units. This allows for the insertion process to be run at each unit level separately. When it comes time to run at the top level for chip level), the process may use special built-in design layers to identify the ownership of silicon areas. According to exemplary embodiments, each unit contains that layer to define ownership to the next hierarchical level. As an alternative, the process of insertion according to exemplary embodiments may first flatten the entire chip design down to the primitive circuit level (including standard circuits, such as ANDs, QRs, latches, etc.) and then insert decaps as they would be inserted in a Oat design.

According to another aspect of the Invention, a user is provided with the flexibility to control the decap density around the "real" circuits, which significantly helps to meet the specialized manufacturing ground rules related to ACLV. To meet these ground rules, the process uses various types of decap circuits, each having different silicon densities. The silicon density of a decap corresponds to the amount of capacitance provided by the decap. Each type may be inserted at a different phase of the process that correlates to different areas of the design with respect to "real" logic circuits, ACLV problems arise when high density decaps are placed too close to actual logic circuits. To control this, the lower density decaps may be placed directly around logic circuits. Then, the rest of the design area may be filled in with high density decaps. The halo width around logic circuits, where low density decaps are placed, may be controlled by the user so that the user is able to achieve the highest decap density without violating ACLV rules. There may also be a default halo width of, e.g., 25 µm that the user may change if desired.

According to an exemplar embodiment, the capability to flatten a hierarchical design is provided in order to complete the decap insertion, process in one application instead of separately collecting input from all levels of hierarchy and risking design interaction problems between those levels of hierarchy at the top level of the design.

Also, if run on a stand-alone level of hierarchy (known, as a unit), the technique described herein recognizes areas within its boundaries that are owned by other units. This comes about from the overlaps of units at the top level of hierarchy (also known as the chip or parent level). These units do not have to be rectangular but can have notches in them where other units own silicon space. The decap insertion process according to exemplary embodiments recognizes special shapes that represent those notches or silicon areas owned by other units, such that decaps are not placed in those areas.

Moreover, according to exemplary embodiments, the checking of metal overlaps with the decap cells (as well as silicon or boundary overlaps) is allowed for in order to avoid short circuits to pre-existing wires that may exist in the design.

Further, the technique described herein can be run incrementally, whereby decaps from previous runs can be loaded into the current design before rerunning the process to insert more decaps.

Also, the technique described herein allows the designer to exclude certain cells from being considered as area or metal blockage when inserting decaps. This feature is provided so that temporary cells that are used for other processes may be ignored, since they will eventually be removed.

According to exemplary embodiments, pre-existing decoupling capacitor cells may be inserted in a hierarchical design by (optionally) flattening the hierarchy. The advantage of this is that the insertion of decaps can be done in one run, and the undesirable unit to unit interactions of silicon shapes can be minimized or all together avoided. Several pre-existing decap designs with different, silicon densities and user-defined spacing values may be used to control ground rule errors related to silicon density and ACLV (across chip line variation). By accounting for this up front during the insertion process, the user minimizes or avoids time-consuming debug later on in the design cycle.

Figure 1:
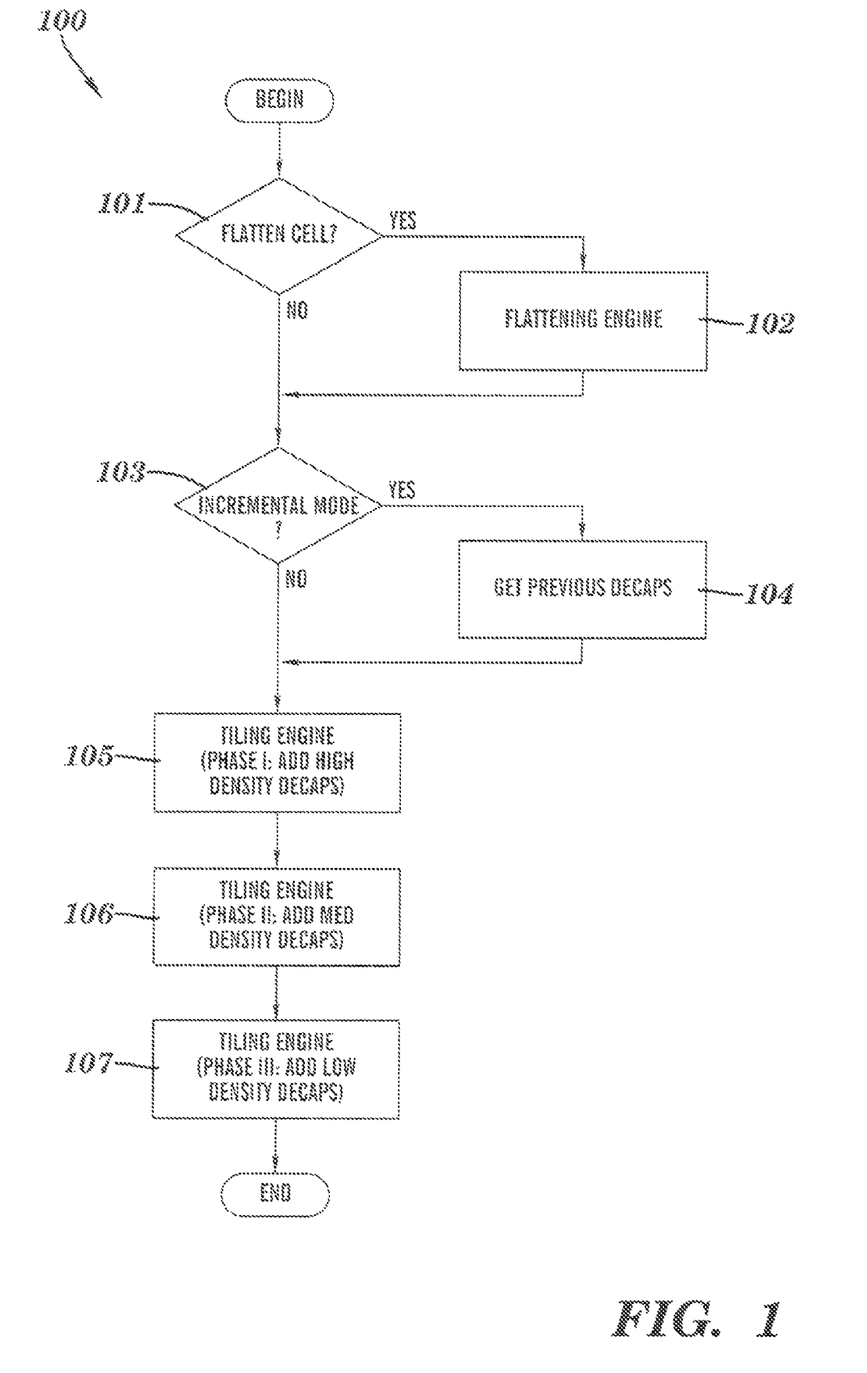
FIG. 1 illustrates a high level process for inserting components into a hierarchical chip design according to an embodiment of the present invention.

Turning now to the drawings, FIG. 1 illustrates a high-level process 100 inserting components, such as decaps, into a hierarchical chip design according to an exemplary embodiment. In step 101, a determination is made whether to flatten the design if it contains nested layers of hierarchy. This determination may be made by the user creating the chip design. Flattening the chip design provides the benefit of having decaps added to the entire design in one iteration of the process instead of adding them at each level of hierarchy. It also eliminates any undesired interactions between decaps in different units or levels of hierarchy, it may take longer to run in this flattened mode. Also, sometimes it may be more beneficial to insert decaps at each level of hierarchy, which is usually done in parallel by various designers.

If the user decides to flatten the cell, a flattening algorithm is called upon to perform this function at step 102. This flattening process is shown in more detail in FIG. 3.

If the user decides not to flatten the cell, or the cell flattening is completed, the process proceeds to step 103 at which a determination is made, e.g., by the user, whether to insert decaps in an incremental mode, i.e., include decaps that were added to the chip design in previous runs of this process. If the user chooses to do so, previous decaps are added in before any further decaps are inserted in at step 104.

The next three steps encompass the three main phases of this process corresponding to three differently sized decap cells (or three different ranges of decap cells). The term "size", as used herein, refers to the size of the silicon within the decap, which corresponds to the amount of capacitance provided by the decap. It should be appreciated that more or fewer differently sized decaps may be used. Three are described here for ease of explanation. In the example shown in FIG. 1, the process is run in three phases in order to control silicon density around logic circuits, thereby reducing the number of ground rule violations (especially ACLV type violations, because these types of violations can affect the consistency of silicon performance across the chip's area). According to an exemplary embodiment, an objective is to insert as many of the high density decaps in the chip design as possible while minimizing the number of ground rule violations resulting from high silicon densities that are too close to logic circuits.

If the determination is made not to include decaps added previously, or the previously decaps are added, the process proceeds to step 103, at which the main tiling engine is called upon to insert high density decaps that have the highest percentage of silicon to provide the best decoupling effect, hi conjunction with this step, a parameter may be passed to the tiling engine, which tells the tiling engine to leave a ring or "halo" of empty space around logic circuits in which the high density decaps will not be inserted. According to an exemplary embodiment, the user has the ability to control the proximity of the high density decaps to logic circuits as will be described in detail below.

In steps 106 avid 107, two more calls to the tiling engine are made in order to insert lower density decaps. There may be two types of these lower density decaps (referred to herein as medium density and high density) in order to maximize decap coverage in the design and leave as little white (empty) space left as possible. Medium density decaps may be inserted first in the halos left around the logic circuits. Then, low density decaps may be inserted in the empty spaces left after insertion of the medium density decaps. In these two steps, the "halo" that was left empty in step 105 may be filled with decaps, due to the fact that the lower density decaps are designed to comply with the ACLV ground rules and are acceptable to place near logic circuits. A drawback is that the decoupling effect is diminished because of the lower decap silicon density. Therefore, it is important that an optimal value be established for the halo width.

It should be appreciated that the order of steps 105, 106 and 107 may be different, as long as decaps having high silicon, densities are inserted, outside the halo around the logic circuits, and decaps having lower silicon densities are inserted in the remaining spaces.

Figure 2:
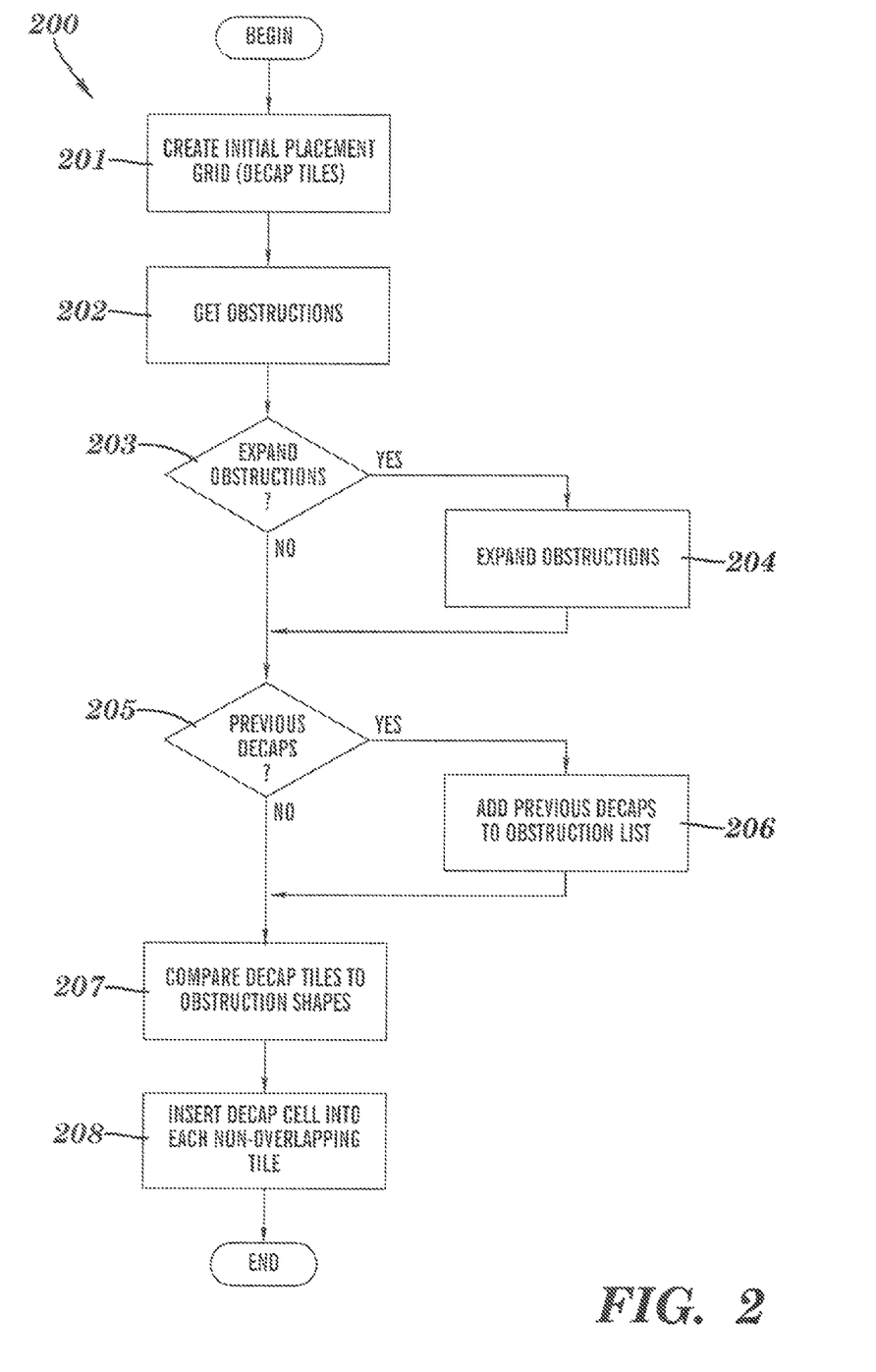
FIG. 2 illustrates a flattening process that may be employed in the process shown in FIG. 1 according to an embodiment of the present invention.

FIG. 2 illustrates a main tiling engine process, which, in one embodiment, may be run three times as shown in FIG. 1. The tiling engine is the main process for inserting insert decaps into a chip design without overlapping other circuits or shapes.

Referring to FIG. 2, the initial decap placement grid is created at step 201 based on the size of the decap that is being inserted (Phase I, II or III). This step involves a simple calculation of tiles across the entire design.

In the next step, 202, legal obstructions are collected throughout the chip design in order to prevent the decaps from overlapping existing circuits or silicon shapes. These obstructions include logic circuits through the entire hierarchy. If the hierarchy had been flattened at the start of the decap insertion process shown in FIG. 1, then this step does not need to descend below the top level of hierarchy. The result of this step is a list of coordinates of the obstruction shapes which will later be compared to the coordinates of the initial decap tiles from step 201 to remove overlaps. The process for retrieving these obstruction, shapes and their coordinates is described in FIG. 4.

Figure 3:
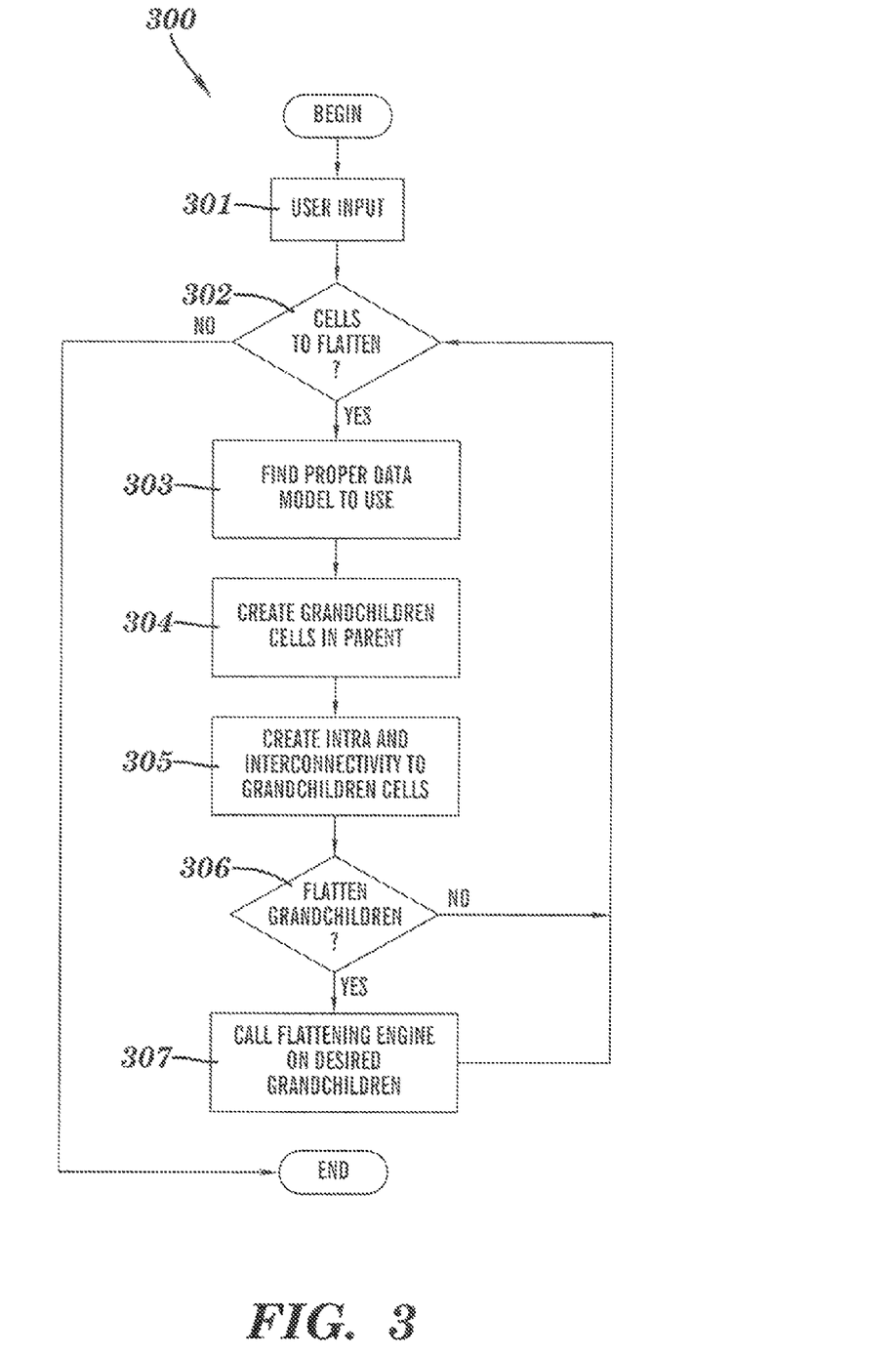
FIG. 3 illustrates a process for placing decap cells in each phase of the process shown in FIG. 1, according to an embodiment of the present invention.

FIG. 3 illustrates a flattening process performed by a flattening engine that was referenced with regard to FIG. 1. The flattening process is used to take an abstracted representation of a hierarchical design and remove an amount of physical, hierarchy, which, may be specified by a user. The process begins with a cell to flatten. In step 301, user input is received specifying which abstracted parts of the cell to process and how far down in the physical hierarchy to flatten each of them. For each child cell that the user specifies to process, the flattening engine flattens that physical instance.

At step 302, a determination is made whether there are cells to flatten. If not, the process ends. If there are steps to flatten, the flattening engine searches the data management system to determine the proper data model to use for each cell at step 303. Then, the entire data model is created for the child cell in the original parent cell, at step 304. In doing so, all of the grandchildren cells are placed into the parent cell appropriately, based on the placement of the child cell in the parent. This may also be referred to as transforming the grandchild's placement about the child's placement in the parent. The netlist of the child cell is copied into the parent cell between, each of the new grandchildren cells. The netlist of the child cell connecting into the parent cell is maintained by creating the appropriate connections between grandchildren and parent cells at step 305. At step 306, a determination is made whether to flatten grandchildren cells, e.g., in response to user input. If the grandchildren cells are not to be flattened, the process return to step 302. Otherwise, the grandchildren cells are flattened at step 307, Steps 306 and 307 shows how, based, e.g., on user input, the grandchildren, great-grandchildren, and on through the hierarchy are flattened into the parent. The process is then repeated for each of the child cells specified by the user by returning to step 302. The output of the flattening process is a parent cell with as much of the child/grandchildren/etc. information as desired by the user.

Figure 4:
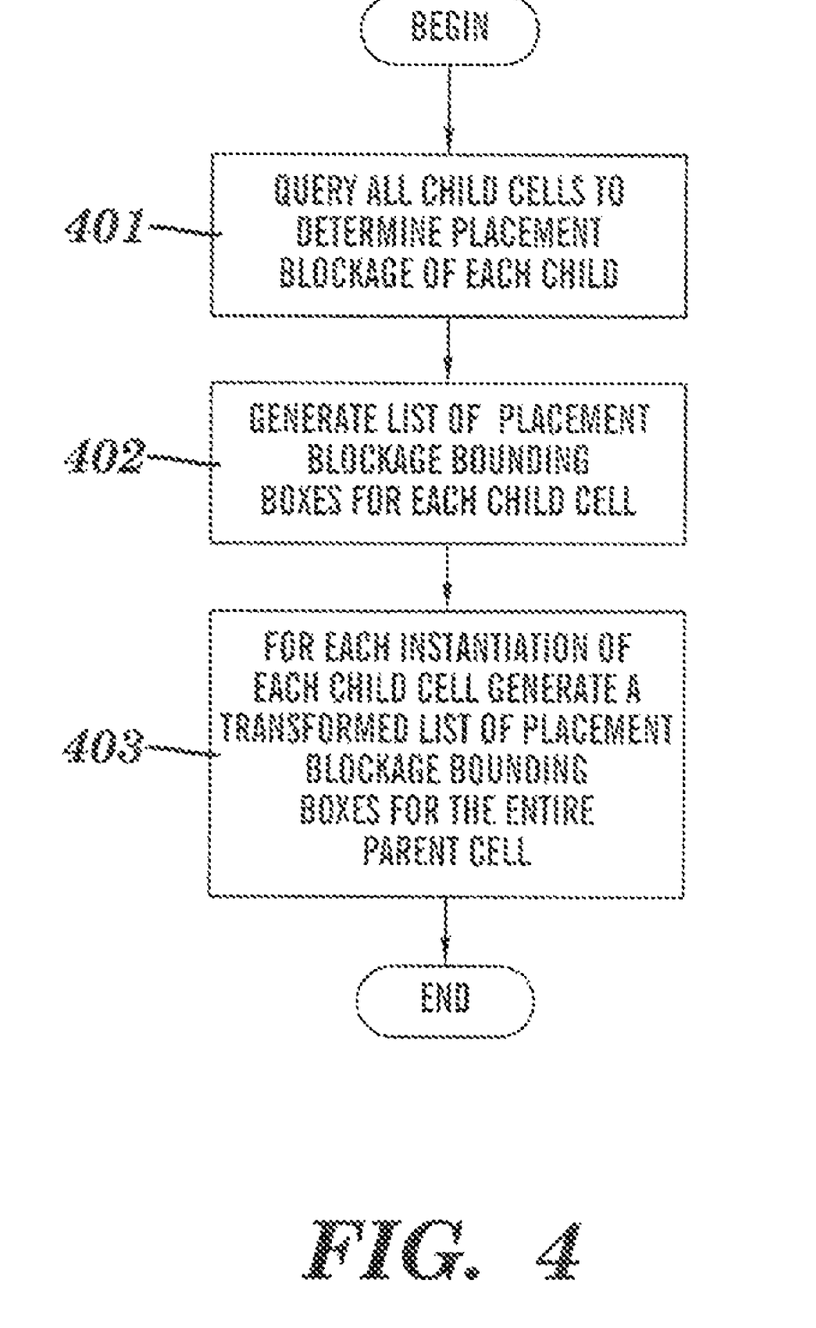
FIG. 4 illustrates a process for determining obstruction shapes for each child cell according to an embodiment of the present invention.

FIG. 4 illustrates a process for determining the obstruction shapes. In step 401, the children cells are inspected to determine what the obstruction for each cell is. In step 402, that obstruction is then represented in one or many bounding boxes. Each cell can have multiple bounding boxes having coordinates representing the cell's obstruction shapes. In step 403, the placement and orientation of each instance of each cell is used to generate a list of all of the obstructions of all of the cells in the parent.

Referring again to FIG. 2, in steps 203 and 204 the user has the option to expand the box coordinates of the obstruction shapes in order to create the 'halo' around all obstructions as described previously. In one embodiment, this step is usually only carried out in Phase I of the main process (see FIG. 1). If this option is chosen, the box coordinates calculated in step 202 are expanded, by some value that may be specified by the user. This is intended to keep high, density decaps away from logic circuits.

In steps 205 and 206, the process checks for the existence of previous decaps which may be specified by the user indicating that be wants to run in incremental mode. The cell in which previous decaps exist is also specified. If these two parameters are defined, then the box coordinates of the previous decaps are calculated and added to the list of obstruction coordinates. However, according to exemplary embodiments, the box coordinates of the previous decaps are not expanded since they are not real logic circuits, and ACLV ground rules will not be violated if newly added decaps abut to previously added decaps.

In step 207, the coordinates of the initial decap tiles are compared, to the coordinates of the obstructions, and those decap tiles that do not touch or overlap any obstructions are selected for insertion. In step 208, coordinates of the non-overlapping decap tiles are used as the locations for inserting the actual decap cells. The reason that real decap cells are not used to begin with (and then later removed if overlaps exist) is to minimize the runtime of the process.

Figure 5:
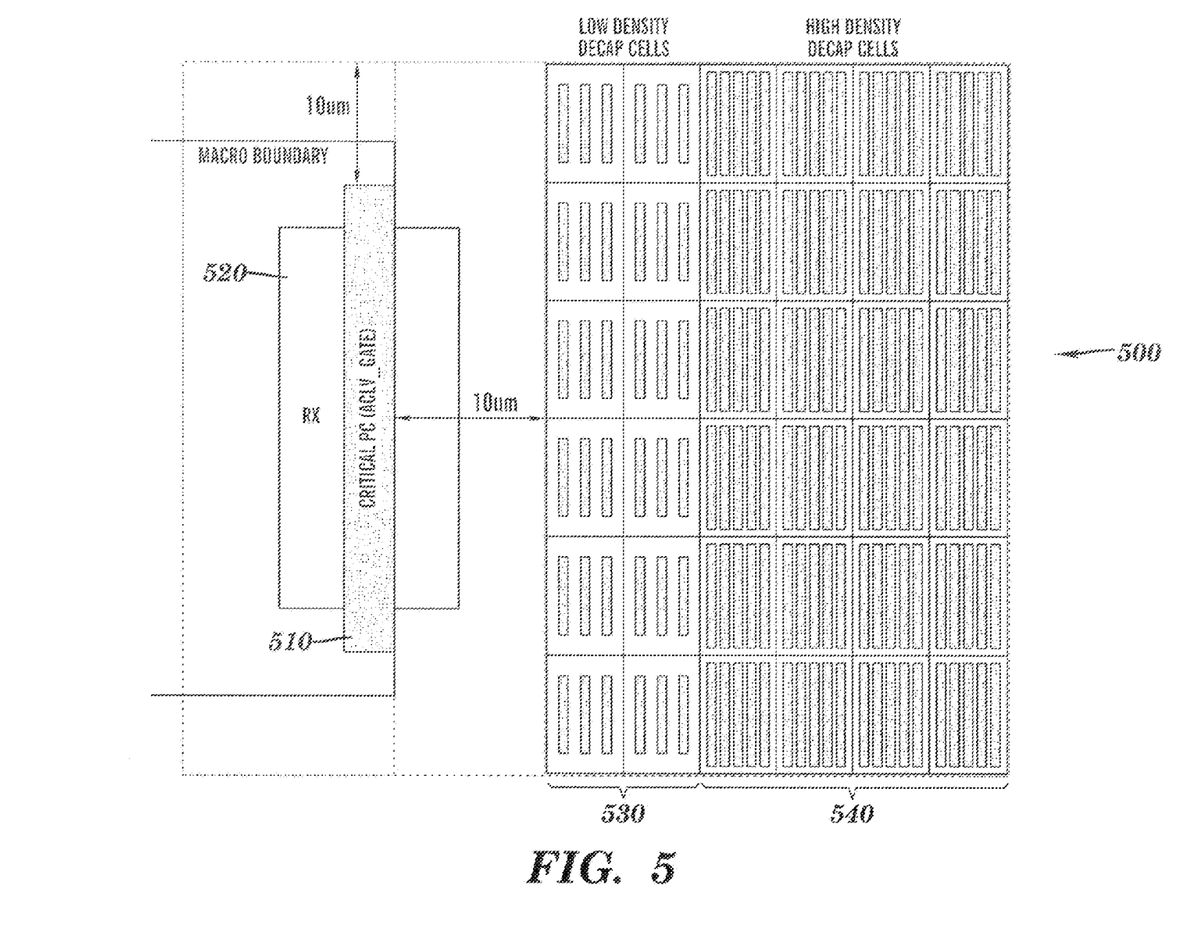
FIG. 5 illustrates a blown up view of a chip design with inserted decaps created using a process according to an embodiment of the present invention.

FIG. 5 illustrates a blowup view 500 of a small, region that has been filled with decaps just outside a logic circuit. In the design shown in FIG. 5, the area of the region is 25 μm by 25 μm, and the PC density is greater than 43%. The critical PC gate (also known as ACLV_GATE) 510 and RX 520 Inside the macro boundary represent an actual logic transistor and are blown out of proportion to better illustrate the process. Decaps have been inserted into the design to the right of the macro boundary (the macro being a child or leaf cell of the unit or design in question). It can be seen that there are two different types of decaps in the drawing (the process uses three but only two types are shown for simplicity sake). The decaps 530 closer to the macro are low density decaps with less RX and PC gate and the decaps 540 to the far right are high density decaps with more silicon.

Figure 6:
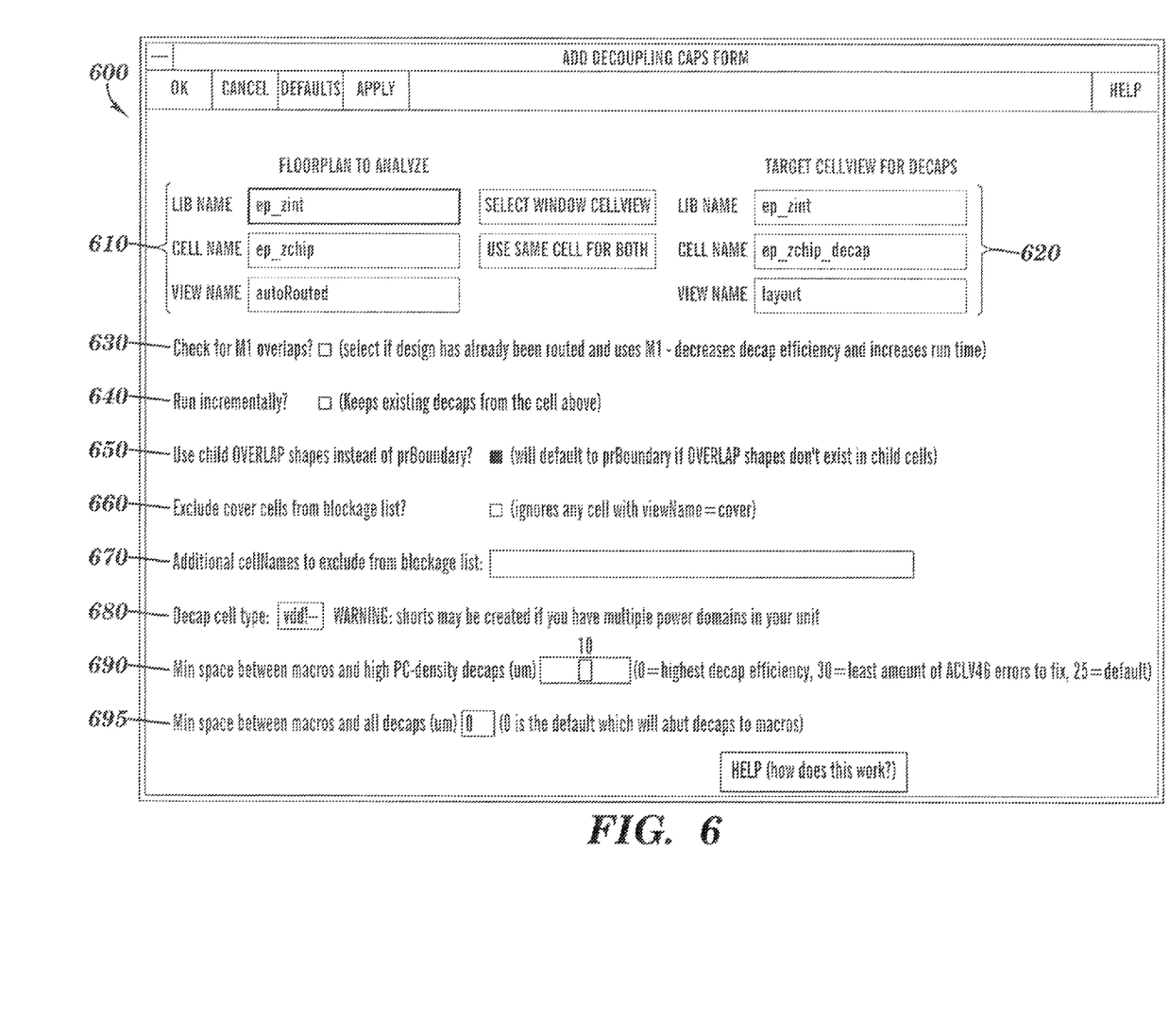
FIG. 6 illustrates an exemplary user interface for setting parameters and selecting components for Insertion into a hierarchical chip design, according to an embodiment of the present invention.

FIG. 6 illustrate an exemplary user interface for selecting components for insertion into a chip design. The screen 600 includes an area 610 for selecting a floorplan to analyze and an area for 620 for selecting a target cell view for the decaps. The screen also include an area 630 for deciding whether to check for M1 (metal) overlaps, an area 640 for deciding whether to include previously inserted decaps in the current chip design, an area 650 for deciding whether to use child overlap shapes, an area 660 for deciding whether to exclude cover cells from a blockage list, an area 670 for selecting additional cell names to exclude from the blockage list, and an area 680 for selecting a decap cell type to insert.

The screen also includes an area 690 for selecting a minimum distance from, the macro boundary where all decaps will be prevented from being placed and an area 695 for selecting a distance from the macro where only low density decaps will be placed. This defines the halo described above. By controlling these two parameters, the user can minimize the number of ground rule errors that result after decaps are inserted. However, if those distances are increased to a point where no ground rule errors will result then it is also probably true that the total amount of decap strength has been decreased. So, there is an optimal balance of the two parameters that must be reached in order to achieve the best results.

Figure 7:
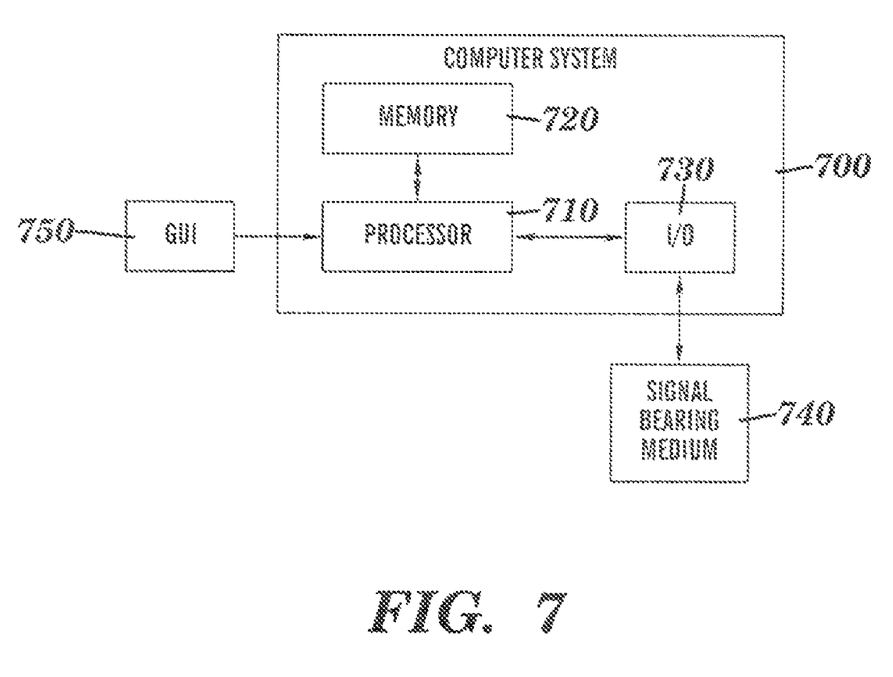
FIG. 7 illustrates an exemplary system for inserting components into a hierarchical chip design according to an embodiment of the present invention.

FIG. 7 illustrates an exemplary system for inserting components into a hierarchical chip design according to exemplary embodiments. The system includes a computer 700 in contact with a signal bearing medium 740 via an input/output interface 730. The signal bearing medium 740 may include a representation of a chip design in which components are to be inserted and may be implemented as, e.g., information permanently stored on non-writable storage media (e.g., read-only memory devices within a computer, such as CD-ROM disks readable by a CD-ROM drive), alterable information stored on a writeable storage media (e.g., floppy disks within a diskette drive or hard-disk drive), information conveyed to a computer by a communications medium, such as through a computer or telephone network, including wireless and broadband communications networks, such as the internet, etc.

The computer 700 includes a processor 710 for inserting components in the chip design represented, e.g., on the signal bearing medium 740 and communicated to the computer via the input/output interface 730. The chip design may be saved into memory 720, e.g., via communication with the I/O interface 730 and the signal bearing medium 740. The processor 710 inserts components into the chip design responsive to input from, e.g., a user via a graphical user interface (GUI) 750. The GUI 750 may display a screen, such as that show in FIG. 6 for enabling the user to select components for insertion and set parameters for controlling insertion. These selections may be saved into memory 720. The process for inserting components into the hierarchical, chip design may be embodied as a program within the memory 720 or on a signal bearing medium, such as the medium 740, and executed by the processor 710.

The capabilities of the present invention can be implemented in software, firmware, hardware or some combination thereof.

As described above, the embodiments of the invention may be embodied in the form of computer-implemented processes and apparatuses for practicing those processes. Embodiments of the invention may also be embodied in the form of computer program, code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc., do not denote any order or importance, but rather the terms first, second, etc., are used to distinguish one element from another.

What is claimed is:

1. A computer program product for inserting components into a current chip design that is cell-based with multiple levels of nested hierarchy, the computer program product comprising:
    a non-transitory computer-readable storage medium readable by a processing circuit and storing instructions, which when executed by the processing circuit perform a method comprising:
    receiving a selection of components having various silicon densities to insert into the current chip design;
    inserting, during a first phase, a second phase, and a third phase, components into the current chip design such that the components do not touch or overlap existing circuits or silicon shapes in the current chip design, wherein the components are inserted such that components having highest silicon densities are placed further away from the existing circuits or silicon shapes than components having lower silicon densities;
    wherein inserting during the first phase comprises inserting highest silicon density decoupling capacitors around the existing circuits or silicon shapes to create a halo of empty space around the existing circuits or silicon shapes in which no highest silicon density decoupling capacitors are inserted into the halo;
    wherein, responsive to completion of the first phase, inserting during the second phase comprises inserting medium silicon density decoupling capacitors into the halo of empty space left around the existing circuits or silicon shapes in which no highest silicon density decoupling capacitors are inserted;

wherein, responsive to completion of the second phase, inserting during the third phase comprises inserting low silicon density decoupling capacitors in any empty space left after inserting the medium silicon density decoupling capacitors into the halo;

wherein inserting components into the current chip design comprises:

selecting a place in the current chip design for inserting each component, based on a silicon density of each component, each place having coordinates; and collecting obstruction shapes representing the existing circuits or silicon shapes in the current chip design, wherein the obstruction shapes only contain the existing circuits or silicon shapes and do not contain any silicon density decoupling capacitors, each obstruction shape having coordinates;

determining whether to expand the obstruction shapes, the determining responsive to across chip line variation ground rules;

in response to a determination to expand the obstruction shapes, expanding the obstruction shapes;

wherein expanding the obstruction shapes comprises increasing a boundary by a specified value for the obstruction shapes; and wherein the expanded obstruction shapes only contain the existing circuits or silicon shapes and do not contain any silicon density decoupling capacitors.

2. The computer program product of claim 1, wherein the components inserted into the current chip design are decoupling capacitors, and the current chip design is a Very Large Scale Integration (VLSI) chip design.

3. The computer program product of claim 1, wherein inserting components into the current chip design comprises:

comparing the coordinates of the obstruction shapes to the coordinates of the places selected in the current chip design for inserting the components, wherein comparing the coordinates compares coordinates of the expanded obstruction shapes to the coordinates of the places selected for inserting the components; and inserting components in the current chip design for which the coordinates of the places selected for inserting the components do not overlap or touch the coordinates of the obstruction shapes.

4. The computer program product of claim 3, wherein the instructions further comprise instructions for:

when run on a stand-alone level of hierarchy being a unit, recognizing areas within the purview of the unit where the areas are owned by other units; and recognizing special shapes of the areas owned by other units.

5. The computer program product of claim 3, wherein the instructions further comprises instruction for:

determining whether to insert components previously inserted into a chip design of a previous run into the current chip design;

in response to a determination to insert the components previously inserted into the chip design of the previous run, adding the places of the previously inserted components of the previous run to the obstruction shapes, such that the obstruction shape coordinates include coordinates of existing circuits or silicon shapes and coordinates of previously inserted components.

6. The computer program product of claim 1, wherein the instructions further comprise instructions for:

determining whether to flatten the current chip design; and in response to a determination to flatten the chip design, creating cells of lower levels of hierarchy in the current chip design in a top level of the current chip design by dissolving hierarchical boundaries while preserving connectivity between lower level cells of the current chip design and the top level of the current chip design.

7. The computer program product of claim 1, wherein collecting obstruction shapes includes:

descending into lower levels of hierarchy of the current chip design to retrieve obstruction shapes having coordinates; and translating the coordinates of the retrieved obstruction shapes into coordinates on a top level of hierarchy of the current chip design.

8. An apparatus for inserting components into a current chip design that is cell-based with multiple levels of nested hierarchy, comprising:

an input for receiving a selection of components having various silicon densities to insert into the current chip design; and a processor for performing a method comprising:

inserting, during a first phase, a second phase, and a third phase, components into the current chip design such that the components do not touch or overlap existing circuits or silicon shapes in the current chip design, wherein the components are inserted such that components having highest silicon densities are placed further away from the existing circuits or silicon shapes than components having lower silicon densities;

wherein inserting during the first phase comprises inserting highest silicon density decoupling capacitors around the existing circuits or silicon shapes to create a halo of empty space around the existing circuits or silicon shapes in which no highest silicon density decoupling capacitors are inserted into the halo;

wherein, responsive to completion of the first phase, inserting during the second phase comprises inserting medium silicon density decoupling capacitors into the halo of empty space left around the existing circuits or silicon shapes in which no highest silicon density decoupling capacitors are inserted;

wherein responsive to completion of the second phase, inserting during the third phase comprises inserting low silicon density decoupling capacitors in any empty space left after inserting the medium silicon density decoupling capacitors into the halo;

wherein inserting components into the current chip design comprises:

selecting a place in the current chip design for inserting each component, based on a silicon density of each component, each place having coordinates; and collecting obstruction shapes representing the existing circuits or silicon shapes in the current chip design, wherein the obstruction shapes only contain the existing circuits or silicon shapes and do not contain any silicon density decoupling capacitors, each obstruction shape having coordinates;

determining whether to expand the obstruction shapes, the determining responsive to across chip line variation ground rules;

in response to a determination to expand the obstruction shapes, expanding the obstruction shapes;

wherein expanding the obstruction shapes comprises increasing a boundary by a specified value for the obstruction shapes; and
wherein the expanded obstruction shapes only contain the existing circuits or silicon shapes and do not contain any silicon density decoupling capacitors.

9. The apparatus of claim 8, wherein the components inserted into the current chip design are decoupling capacitors, and the current chip design is a Very Large Scale Integration (VLSI) chip design.

10. The apparatus of claim 8, wherein inserting components into the current chip design comprises:
comparing the coordinates of the obstruction shapes to the coordinates of the places selected in the current chip design for inserting the components; and
inserting components in the current chip design for which the coordinates of the places selected for inserting the components do not overlap or touch the coordinates of the obstruction shapes.

11. The apparatus of claim 10, wherein the comparing the coordinates compares coordinates of the expanded obstruction shapes to the coordinates of the places selected for inserting the components.

12. The apparatus of claim 10, wherein the processor further performs:
determining whether to insert components previously inserted into a chip design of a previous run into the current chip design;
in response to a determination to insert the components previously inserted into the chip design of the previous run, adding the places of the previously inserted components of the previous run to the obstruction shapes, such that the obstruction shape coordinates include coordinates of existing circuits or silicon shapes and coordinates of previously inserted components.

13. The apparatus of claim 8, wherein the processor further performs:
determining whether to flatten the current chip design; and
in response to a determination to flatten the chip design, creating cells of lower levels of hierarchy in the current chip design in a top level of the current chip design by dissolving hierarchical boundaries while preserving connectivity between lower level cells of the current chip design and the top level of the current chip design.

14. The apparatus of claim 8, collecting obstruction shapes includes:
descending into lower levels of hierarchy of the current chip design to retrieve obstruction shapes having coordinates; and
translating the coordinates of the retrieved obstruction shapes into coordinates on a top level of hierarchy of the current chip design.

15. A method for inserting components into a current chip design that is cell-based with multiple levels of nested hierarchy, comprising:
receiving a selection of components having various silicon densities to insert into the current chip design; and
inserting, during a first phase, a second phase, and a third phase, components, using a computer, into the current chip design such that the components do not touch or overlap existing circuits or silicon shapes in the current chip design, wherein the components are inserted such that components having highest silicon densities are placed further away from the existing circuits or silicon shapes than components having lower silicon densities;
wherein inserting during the first phase comprises inserting highest silicon density decoupling capacitors around the existing circuits or silicon shapes to create a halo of empty space around the existing circuits or silicon shapes in which no highest silicon density decoupling capacitors are inserted into the halo;
wherein, responsive to completion of the first phase, inserting during the second phase comprises inserting medium silicon density decoupling capacitors into the halo of empty space left around the existing circuits or silicon shapes in which no highest silicon density decoupling capacitors are inserted;
wherein, responsive to completion of the second phase, inserting during the third phase comprises inserting low silicon density decoupling capacitors in any empty space left after inserting the medium silicon density decoupling capacitors into the halo;
wherein inserting components into the current chip design comprises:
selecting a place in the current chip design for inserting each component, based on a silicon density of each component, each place having coordinates; and
collecting obstruction shapes representing the existing circuits or silicon shapes in the current chip design, wherein the obstruction shapes only contain the existing circuits or silicon shapes and do not contain any silicon density decoupling capacitors, each obstruction shape having coordinates;
determining whether to expand the obstruction shapes, the determining responsive to across chip line variation ground rules;
in response to a determination to expand the obstruction shapes, expanding the obstruction shapes;
wherein expanding the obstruction shapes comprises increasing a boundary by a specified value for the obstruction shapes; and
wherein the expanded obstruction shapes only contain the existing circuits or silicon shapes and do not contain any silicon density decoupling capacitors.

16. The method of claim 15, wherein the components inserted into the current chip design are decoupling capacitors, and the current chip design is a Very Large Scale Integration (VLSI) chip design.

17. The method of claim 15, wherein the step of inserting components into the current chip design comprises:
comparing the coordinates of the obstruction shapes to the coordinates of the places selected in the current chip design for inserting the components; and
inserting components in the current chip design for which the coordinates of the places selected for inserting the components do not overlap or touch the coordinates of the obstruction shapes.

18. The method of claim 17, wherein the of comparing the coordinates compares coordinates of the expanded obstruction shapes to the coordinates of the places selected for inserting the components.

19. The method of claim 17, further comprising,
determining whether to insert components previously inserted into a chip design of a previous run into the current chip design;
in response to a determination to insert the components previously inserted into the chip design of the previous run, adding the places of the previously inserted components of the previous run to the obstruction shapes, such that the obstruction shape coordinates include coordinates of existing circuits or silicon shapes and coordinates of previously inserted components.

20. The method of claim 15, further comprising:
determining whether to flatten the current chip design; and in response to a determination to flatten the chip design, creating cells of lower levels of hierarchy in the current chip design in a top level of the current chip design by dissolving hierarchical boundaries while preserving connectivity between lower level cells of the current chip design and the top level of the current chip design.

21. The method of claim 15, wherein the step of collecting obstruction shapes includes:

descending into lower levels of hierarchy of the current chip design to retrieve obstruction shapes having coordinates; and translating the coordinates of the retrieved obstruction shapes into coordinates on a top level of hierarchy of the current chip design.

\* \* \* \* \*